United States Patent [19]

Koyabu

[11] Patent Number: 5,517,050
[45] Date of Patent: May 14, 1996

[54] SEMICONDUCTOR INTEGRATED CIRCUIT DEVICE HAVING COMPONENT TRANSISTOR WITH PROTECTED GATE ELECTRODE

[75] Inventor: Kunihiro Koyabu, Tokyo, Japan

[73] Assignee: NEC Corporation, Tokyo, Japan

[21] Appl. No.: 350,081

[22] Filed: Nov. 29, 1994

[30] Foreign Application Priority Data

Nov. 30, 1993 [JP] Japan .................................. 5-323340

[51] Int. Cl.$^6$ ............................................. H01L 23/62
[52] U.S. Cl. ......................... 257/357; 257/328; 257/360; 257/750; 257/758
[58] Field of Search ..................... 257/347, 379, 257/392, 272, 279, 281, 328, 357, 360, 750, 758

[56] References Cited

U.S. PATENT DOCUMENTS 5,021,843 6/1991 Ohmi ...................................... 257/379
5,281,828 1/1994 Muragishi ................................ 257/65

FOREIGN PATENT DOCUMENTS

3169072 7/1991 Japan ............................. H01L 27/112

Primary Examiner—Edward Wojciechowicz
Attorney, Agent, or Firm—Sughrue, Mion, Zinn, Macpeak & Seas

[57] ABSTRACT

An inverter incorporated in a semiconductor integrated circuit device is implemented by a series combination of a p-channel enhancement type field effect transistor and an n-channel enhancement type field effect transistor coupled between a positive power voltage line and a ground voltage line, the p-channel enhancement type field effect transistor and the n-channel enhancement type field effect transistor have a common gate electrode coupled through normally-off protective transistors to the positive power voltage line and the ground voltage line, and excess electric charges are discharged through a parasitic diode between the drain region and a substrate of either protective transistor so as to prevent gate oxide films from the excess electric changes.

11 Claims, 8 Drawing Sheets

SEMICONDUCTOR INTEGRATED CIRCUIT DEVICE HAVING COMPONENT TRANSISTOR WITH PROTECTED GATE ELECTRODE

FIELD OF THE INVENTION

This invention relates to a semiconductor integrated circuit device and, more particularly, to a semiconductor integrated circuit device having component field effect transistors with protected gate electrodes for preventing gate insulating films from a damage.

DESCRIPTION OF THE RELATED ART

Figure 1:
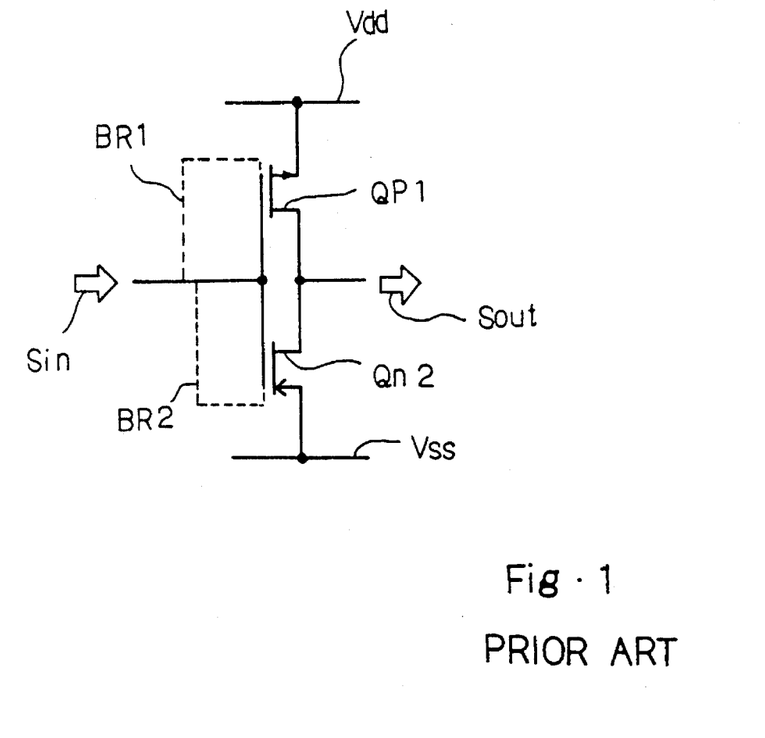
FIG. 1 is a circuit diagram showing the arrangement of the prior art inverter.

A typical circuit component of the semiconductor integrated circuit device is an inverter, and a standard inverter is implemented by a series of p-channel enhancement type field effect transistor Qp1 and an n-channel enhancement type field effect transistor Qn2 coupled between a high power voltage line Vdd and a low voltage line Vss as shown in FIG. 1 of the drawings.

Although an input signal Sin is distributed from a mid point between the p-channel enhancement type field effect transistor Qp1 an the n-channel enhancement type field effect transistor Qn2 to the gate electrodes of the field effect transistors Qp1 and Qn2 in FIG. 1, a wiring is connected to the gate electrode of either p-channel or n-channel enhancement type field effect transistor Qp1 or Qn2 as indicated by a broken line BR1 or BR2, and the input signal Sin is firstly supplied from the wiring BR1 or BR2 to the gate electrode of the field effect transistor Qp1 or Qn2, then being transferred to the gate electrode of the other field effect transistor Qn2 or Qp1.

Figure 2:
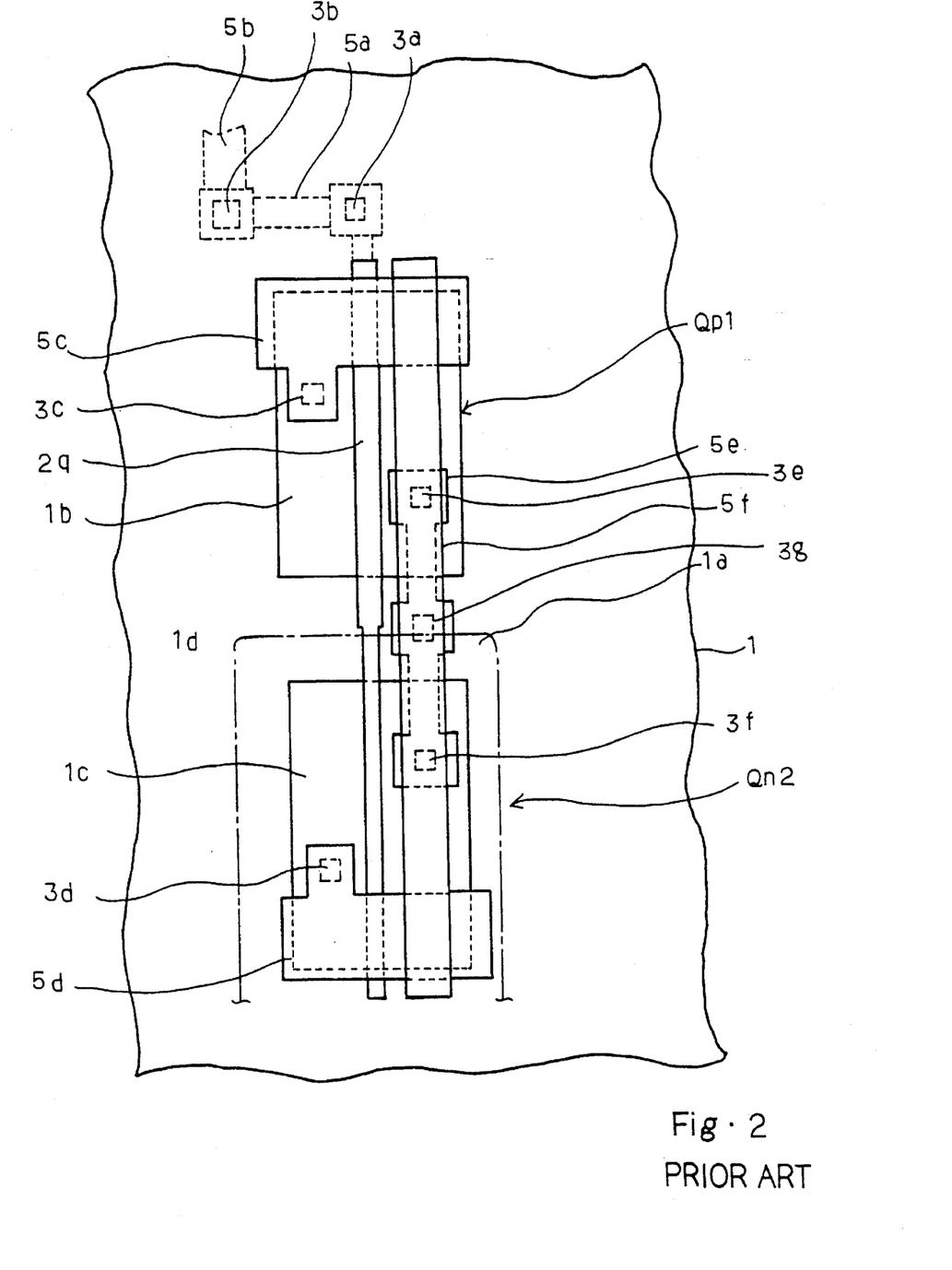
FIG. 2 is a plan view showing the layout of the prior art inverter on the silicon substrate.
Figure 3:
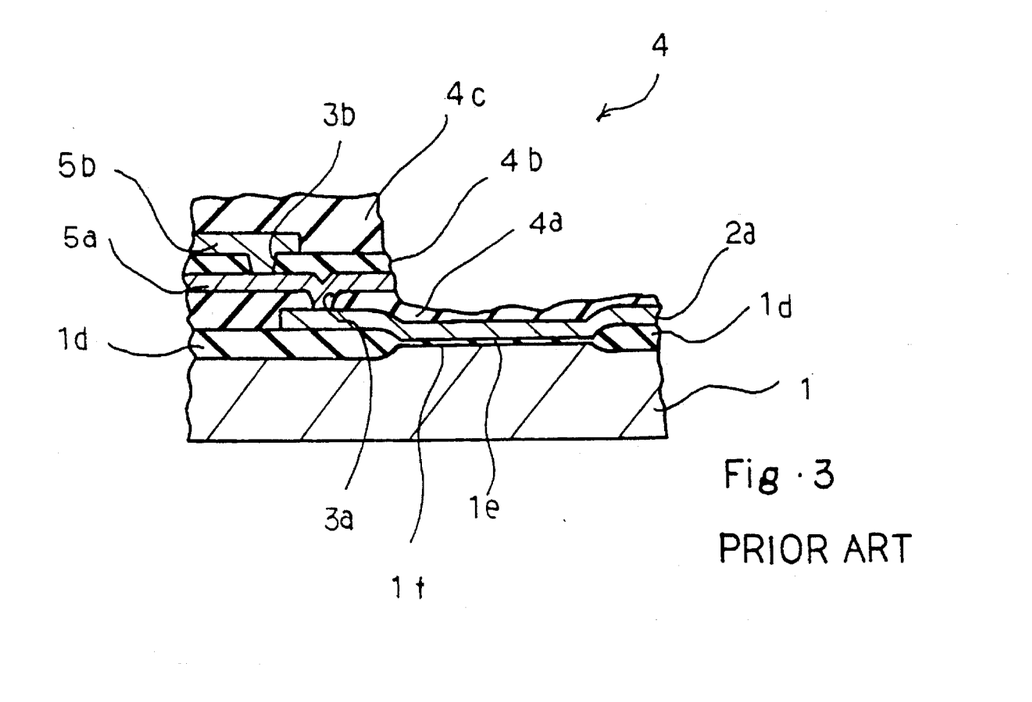
FIG. 3 is a cross sectional view showing the structure of the multi-level wiring structure incorporated in the prior art inverter.

FIG. 2 shows a layout of the inverter fabricated on an n-type silicon substrate 1, and an inter-level insulating film structure and a gate oxide film are deleted from FIG. 2 for better understanding. However, the inter-level insulating film structure and the gate oxide film are illustrated in FIG. 3.

A p-type well 1a is formed in the n-type silicon substrate 1, and a p-type impurity region 1b and an n-type impurity region 1c are defined in the n-type silicon substrate 1 and the p-type well 1a by a thick field oxide layer 1d.

A polysilicon gate electrode 2a extends on the gate oxide film 1e across the p-type impurity region 1b and the n-type impurity region 1c, and is shared between the p-type enhancement type field effect transistor Qp1 and the n-type enhancement type field effect transistor Qn2. As will be seen from FIG. 3, the polysilicon gate electrode 2a is electrically connected through a contact hole 3a formed in a lower-level insulating layer 4a to a first-level aluminum wiring 5a which in turn is connected through a contact hole 3b formed in an intermediate-level insulating layer 4b to a second-level aluminum wiring 5b. The second-level aluminum wiring 5b is covered with an upper-level insulating layer 4c. The lower-level insulating layer 4a, the intermediate-level insulating layer 4b and the upper-level insulating layer 4c form in combination the inter-level insulating film structure 4.

Turning back to FIG. 2 of the drawings, a first-level aluminum power supply line 5c is connected through a contact hole 3c of the lower-level insulating layer 4a to the left portion of the p-type impurity region 1b, and a first-level aluminum low voltage line 5d is connected through a contact hole 3d formed in the lower-level insulating layer 4a to the left portion of the n-type impurity region 1c. The first-level aluminum power supply line 5c and the first-level aluminum low voltage line 5d correspond to the high power voltage line Vdd and the low voltage line Vss in FIG. 1. The left portions of the p-type impurity region 1b and the n-type impurity region 1c serve as the source regions of the p-channel enhancement type field effect transistor Qp1 and the n-channel enhancement type field effect transistor Qn2, respectively.

On the other hand, the right portions of the p-type impurity region 1b and the n-type impurity region 1c serve as the drain regions of the p-channel enhancement type field effect transistor Qp1 and the n-channel enhancement type field effect transistor Qn2, respectively. A first-level aluminum interconnection 5e is connected through contact holes 3e and 3f formed in the lower-level insulating layer 4a to the drain regions. A second-level aluminum wiring 5f is connected through a contact hole 3g formed in the intermediate-level insulating layer 4b to an intermediate portion of the first-level aluminum interconnection 5e.

Thus, the input signal Sin is supplied through the second-level aluminum wiring 5b and the first-level aluminum wiring 5a to the polysilicon gate electrode 2a, and the polysilicon gate electrode 2a propagates the input signal Sin from the upper side to the lower side in FIG. 2. The p-channel enhancement type field effect transistor Qp1 and the n-channel enhancement type field effect transistor Qn2 complementarily turn on and off depending upon the voltage level of the input signal Sin, and one of the low voltage level and the high power voltage level Vdd as supplied from the first-level aluminum power supply line 5c or the first-level aluminum low voltage line 5d through the first-level aluminum interconnection 5e to the second-level aluminum wiring 5f as the output signal Sout.

If the inverters shown in FIG. 2 are coupled in series, the signal is propagated through the combination of the aluminum wirings 5b/5a, the polysilicon gate electrode 2a and the aluminum wirings 5e/5f from the inverter to the next inverter.

In a process of fabricating the prior art semiconductor integrated circuit device, the contact holes 3b and 3g are formed in the intermediate-level insulating layer 4b by using dry etching. In the dry etching process, the upper-level aluminum wiring 5a sometimes transfers electric charge to the polysilicon gate electrode 2a due to, for example, a poor alignment, and the electric charge is accumulated in the polysilicon gate electrode 2a. Since the gate oxide film 1e is very thin, i.e., 0.1 micron to 0.5 micron, strong electric field is created across the gate oxide film 1e, and the gate oxide film 1e is liable to be damaged. The damaged gate oxide film 1e provides a leakage path 1f from the polysilicon gate electrode 2a to the silicon substrate 1, and various malfunctions can take place.

If the polysilicon gate electrode is directly connected to a signal input pad or a signal output pad, a protective element provided for the pad discharges the electric charge, and the gate oxide film is not damaged. However, only a small number of field effect transistors are connected to the pads, and the protective elements associated with the pads are not available for most of the component field effect transistors.

Figure 4:
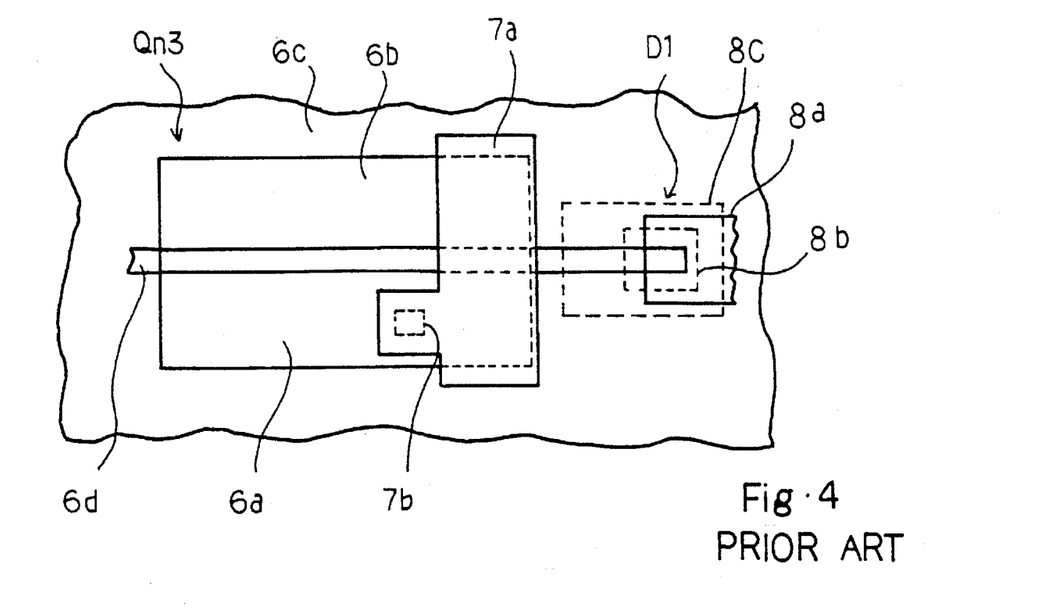
FIG. 4 is a plan view showing the layout of a prior art field effect transistor with the gate electrode coupled to a protective diode.

In order to prevent the polysilicon gate electrode from the electric charge, Japanese Patent Publication of Unexamined Application No. 3-169072 discloses a protective diode coupled to the polysilicon gate electrode. FIG. 4 illustrates an n-channel enhancement type field effect transistor Qn3 associated with a protective diode D1 disclosed in the Japanese Patent Publication. The n-channel enhancement type field effect transistor Qn3 has n-type source and drain regions 6a and 6b formed in a p-type silicon substrate 6c, and a polysilicon gate electrode 6d extends on a gate insulating layer (not shown) between the source and drain regions 6a and 6b. An aluminum low voltage line 7a is held in contact with the n-type source region 6a through a contact hole 7b formed in an inter-level insulating layer (not shown). An n-type impurity region 8a and the p-type silicon substrate 6c form the protective diode D1, and the polysilicon gate electrode 6d is held in contact through a direct contact hole 8b formed in a thick field oxide layer (not shown) to the n-type impurity region 8a. The p-type silicon substrate 6c and the n-type impurity region 8a respectively serve as an anode and a cathode of the protective diode D1.

Figure 5:
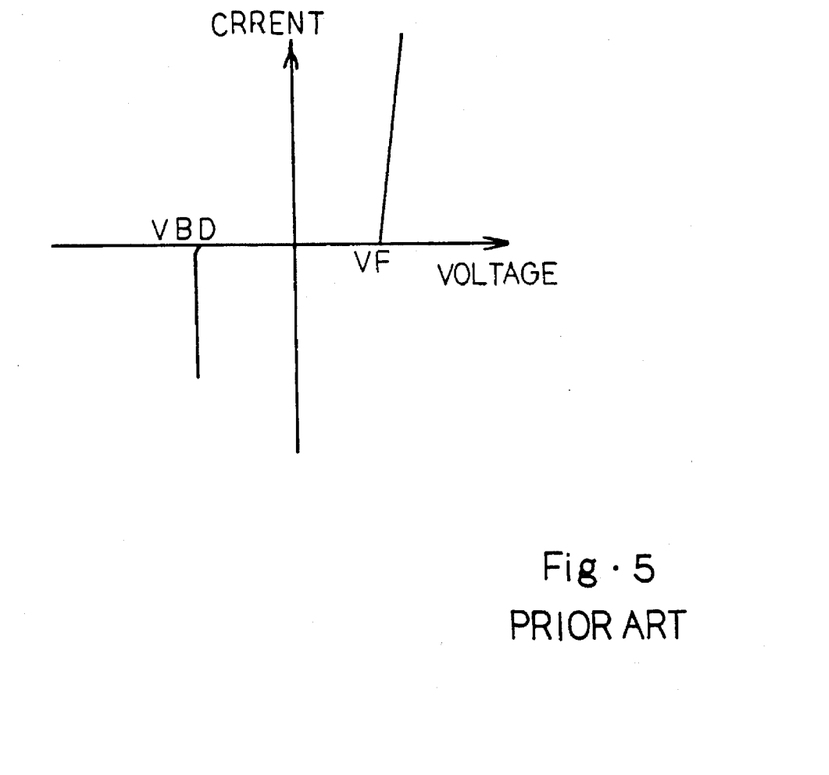
FIG. 5 is a graph showing the voltage-to-current characteristics of the protective diode.

The protective diode D1 has voltage-to-current characteristics shown in FIG. 5. While a bias voltage is in a voltage range less than a forward bias voltage VF and greater than a breakdown voltage VBD, the protective diode D1 does not allow current to flow. However, when the bias voltage is greater than the forward bias voltage VF or less than the breakdown voltage VBD, the current flows across the protective diode. The forward voltage VF is 0.3 volt to 1.0 volt, and the breakdown voltage VBD ranges between −10 volts and −20 volts.

In the fabrication process for the semiconductor integrated circuit device with the protective diodes, the direct contact hole 8b is formed in the thick field insulating layer after the growth of the gate insulating layer, and polysilicon is deposited over the entire surface of the structure. The polysilicon layer is patterned into the polysilicon gate electrode 6d, and is held in contact through the direct contact hole 8b with the n-type impurity region 8a.

While a contact hole is being formed in an inter-level insulating layer through dry etching, positive electric charge tends to accumulate in the polysilicon gate electrode 6d. When the accumulated electric charge causes the polysilicon gate electrode 6d to exceed the breakdown voltage, the positive electric charge flows through the protective diode D1 into the p-type silicon substrate 6c, and the protective diode D1 prevents the thin gate insulating layer from being damaged.

Thus, the protective diode D1 rescues the thin gate insulating layer from damage. However, if the polysilicon gate electrode 6d is still connected to the protective diode D1 upon completion of the semiconductor integrated circuit device, the protective diode D1 deteriorates the device characteristics. For this reason, the polysilicon gate electrode 6d is disconnected by breaking a cut area 8c after the patterning stage of aluminum wirings.

However, if a semiconductor integrated circuit device has a multi-level wiring structure, the cut area 8c is broken before completion of the multi-level wiring structure, and the protective diode D1 can not prevent the gate insulating layer from a dry etching on an upper-level insulating layer.

Of course, if the contact holes in the upper-level insulating layer are offset from the polysilicon gate electrode 6d, the dry etching does not damage the gate insulating layer. However, such an offset arrangement sets a limit to the layout of the integrated circuit, and is not desirable for the integration density.

SUMMARY OF THE INVENTION

It is therefore an important object of the present invention to provide a semiconductor integrated circuit device which is not damaged by electric charge due to a dry etching on a multi-level wiring structure.

To accomplish the object, the present invention proposes to connect a normally off-type transistor between a signal input line and a power voltage line.

In accordance with the present invention, there is provided a semiconductor integrated circuit device fabricated on a semiconductor substrate, comprising: a first field effect transistor having source and drain regions formed in a surface portion of the semiconductor substrate, a gate insulating layer covering the surface portion and a gate electrode extending on the gate insulating layer and changed in voltage level within a predetermined range in a standard operation of the semiconductor integrated circuit device; an inter-level insulating film structure having a first inter-level insulating layer covering the semiconductor substrate and a second inter-level insulating layer covering the first inter-level insulating layer; a multi-level wiring structure serving as power supply lines and signal lines, and having a plurality of first-level wirings extending on the first inter-level insulating layer and including a first-level wiring connected through a first contact hole formed in the first inter-level insulating layer to the gate electrode, and a plurality of second-level wirings extending on the second inter-level insulating layer and selectively connected through second contact holes formed in the second inter-level insulating layer to the field effect transistor and the plurality of first-level wirings; and a first normally-off element coupled between the gate electrode and one of the power supply lines, and turned off in the predetermined range, the first normally-off element allowing electric charges to flow therethrough to a constant voltage source when the gate electrode exceeds a threshold of the first normally-off element in a fabrication process of the semiconductor integrated circuit device.

BRIEF DESCRIPTION OF THE DRAWINGS

The feature and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 6:
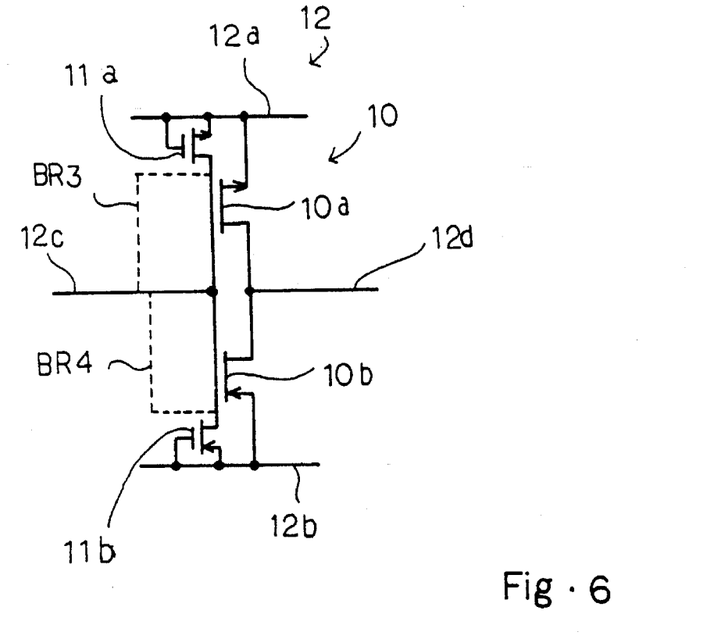
FIG. 6 is a circuit diagram showing the arrangement of an inverter and protective transistors incorporated in a semiconductor integrated circuit device according to the present invention.

Referring to FIG. 6 of the drawings, an inverter 10 is accompanied with protective transistors 11a and 11b, and a multi-level wiring structure 12 is provided for the inverter 10. The inverter 10, the protective transistors 11a and 11b and the multi-level wiring structure 12 form parts of a semiconductor integrated circuit device embodying the present invention.

The inverter 10 is implemented by a series combination of a p-channel enhancement type field effect transistor 10a and an n-channel enhancement type field effect transistor 10b coupled between a high power voltage line 12a and a low voltage line 12b. An input signal line 12c is connected to the gate electrode of the p-channel enhancement type field effect transistor 10a and the gate electrode of the n-channel enhancement type field effect transistor 10b, and an output signal line 12d is connected to the common drain node of the field effect transistors 10a and 10b. The high power voltage line 12a, the low voltage line 12b, the input signal line 12c and the output signal line 12d form parts of the multi-level wiring structure 12.

Although the input signal line 12c is branched at a mid point between the p-channel enhancement type field effect transistor 10a and the n-channel enhancement type field effect transistor 10b in FIG. 6, the input signal line 12c firstly passes through one of the p-channel enhancement type field effect transistor 10a and the n-channel enhancement type field effect transistor 10b as indicated by either broken line BR3 or BR4, and extends to the other field effect transistor 10b or 10a. Thus, the input signal line 12c partially serves as the gate electrode of the p-channel enhancement type field effect transistor 10a and the gate electrode of the n-channel enhancement type field effect transistor 10b.

The protective transistor 11a is of the p-channel enhancement type, and is connected between the high power voltage line 12a and one end of the input signal line 12c. On the other hand, the protective transistor 11b is of the n-channel enhancement type, and is connected between the input signal line 12c and the low voltage line 12b. The gate electrode of the p-channel enhancement type protective transistor 11a is connected to the high power voltage line 12a, and is turned off in a standard operating environment. Similarly, the n-channel enhancement type protective transistor 11b has a gate electrode coupled to the low voltage line 12b, and is also turned off in the standard operating environment. In the standard operating environment, the inverter 10 cooperates with other circuit components for achieving a task of the semiconductor integrated circuit device, and the input signal line 12c changes the voltage level thereof between a normal voltage range.

Figure 7:
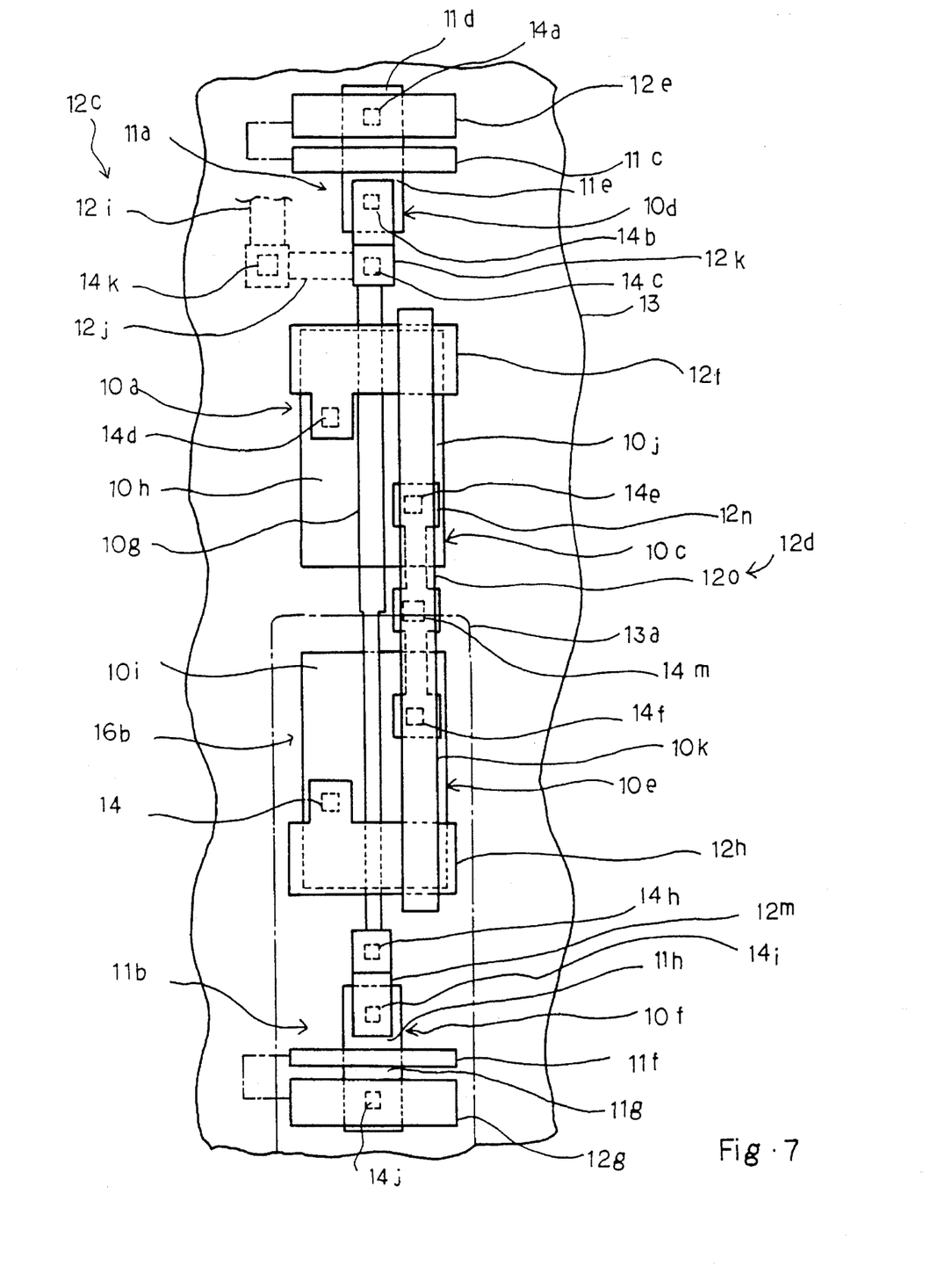
FIG. 7 is a plan view showing the layout of the inverter shown in FIG. 6.

Turning to FIG. 7 of the drawings, a layout of the inverter 10, the protective transistors 11a and 11b and the multi-level wiring structure 12 is illustrated, and is detailed hereinbelow. The semiconductor integrated circuit device embodying the present invention is fabricated on an n-type silicon substrate 13, and a p-type well 13a is formed in the n-type silicon substrate 13. Although a thick field oxide layer, a thin gate insulating layer and an inter-level insulating film structure are incorporated in the structure of the semiconductor integrated circuit device, these layers and films are deleted from the illustration of FIG. 7 to allow for a better understanding.

A wide p-type impurity region 10c and a narrow p-type impurity region 10d are formed in the n-type silicon substrate 13, and the wide p-type impurity region 10c is electrically isolated from the narrow p-type impurity region 10d. On the other hand, a wide n-type impurity region 10e and a narrow n-type impurity region 10f are formed in the p-type well 13a, and the wide n-type impurity region 10e is electrically isolated from the narrow n-type impurity region 10f. The gate insulating films (not shown) cover the wide p-type impurity region 10c, the narrow p-type impurity region 10d, the wide n-type impurity region 10e and the narrow impurity region 10f, respectively.

A polysilicon gate electrode 10g extends on the gate insulating layers on the wide p-type impurity region 10c and the wide n-type impurity region 10e, and channel regions under the polysilicon gate electrode 10g electrically separates a p-type source region 10h and an n-type source region 10i from a p-type drain region 10j and an n-type drain region 10k, respectively. The p-type source region 10h, the p-type drain region 10j, the gate insulating layer, the channel region and the polysilicon gate electrode 10g as a whole constitute the p-type enhancement type field effect transistor 10a, and the n-type source region 10i, the n-type drain region 10k, the gate insulating layer, the channel region and the polysilicon gate electrode 10g form the n-type enhancement type field effect transistor 10b.

A polysilicon gate electrode 11c extends on the gate insulating layer on the narrow p-type impurity region 10d, and a p-type source region 11d and a p-type drain region 11e are defined on both sides of a channel region under the polysilicon gate electrode 11c. Similarly, a polysilicon gate electrode 11f extends on the gate insulating layer on the narrow n-type impurity region 10f, and an n-type source region 11g and an n-type drain region 11h are defined on both sides of a channel region under the polysilicon gate electrode 11f. The polysilicon gate electrode 11c, the gate insulating layer on the narrow p-type impurity region 10d, the channel region, the p-type source region 11d and the p-type drain region 11e form the p-channel enhancement type protective transistor 11a, and the polysilicon gate electrode 11f, the gate insulating layer on the narrow n-type impurity region 10f, the channel region, the n-type source region 11g, the n-type drain region 11h as a whole constitute the n-channel enhancement type protective transistor 11b.

The p-channel enhancement type field effect transistor 10a, the n-channel enhancement type field effect transistor 10b, the p-channel enhancement type protective transistor 11a and the n-channel enhancement type protective transistor 11b are covered with a lower inter-level insulating layer (not shown). The lower inter-level insulating layer, together with an intermediate inter-level insulating layer (not shown)

and an upper inter-level insulating layer (not shown) forms the interlevel.

The lower inter-level insulating layer has contact holes 14a, 14b, 14c, 14d, 14e, 14f, 14g, 14h, 14i and 14j, and contact holes 14k and 14m are formed in the intermediate inter-level insulating layer. The contact holes 14a to 14m allow the multi-level wiring structure 12 to provide interconnections.

In this instance, the multi-level wiring structure 12 has first-level aluminum wirings extending on the lower inter-level insulating layer and second-level aluminum wirings extending on the intermediate inter-level insulating layer, and the upper inter-level insulating layer covers the second-level aluminum wirings. Namely, a first-level aluminum wiring 12e is held in contact through the contact hole 14a with the p-type source region 11d, and is electrically connected to the polysilicon gate electrode 11c. Another first-level aluminum wiring 12f passes through the contact hole 14d, and is held in contact with the p-type source region 10h. The first-level aluminum wirings 12e and 12f serve as the high power voltage line 12a.

On the other hand, a first-level aluminum wiring 12g is held in contact through the contact hole 14j with the n-type source region 11g, and is electrically connected to the polysilicon gate electrode 11f. Another first-level aluminum wiring 12h passes through the contact hole 14g, and is in contact with the n-type source region 10i. The first-level aluminum wirings 12g and 12h serve as the low voltage line 12b.

A second-level aluminum wiring 12i is connected through the contact hole 14k to a first-level aluminum wiring 12j, and the first-level aluminum wiring 12j is merged with another first-level aluminum wiring 12k. The first-level aluminum wirings 12j and 12k are held in contact with the polysilicon gate electrode 10g and the p-type drain region 11e through the contact holes 14c and 14b, respectively. The polysilicon gate electrode 10g is connected through the contact hole 14h to a first-level aluminum wiring 12m which in turn is connected through the contact hole 14i to the n-type drain region 11h. The second-level aluminum wiring 12i, the first-level aluminum wirings 12j, 12k and 12m and the polysilicon gate electrode 10g form in combination the input signal line 12c.

A first-level aluminum wiring 12n is connected at both end portions thereof through the contact holes 14e and 14f to the p-type drain region 10j and the n-type drain region 10k, and in turn is connected at an intermediate portion through the contact hole 14m to a second-level aluminum wiring 12o. The first-level aluminum wiring 12n and the second-level aluminum wiring 12o form in combination the output signal line 12d.

As described hereinbefore, the p-channel enhancement type protective transistor 11a and the n-channel enhancement type protective transistor 11b are normally turned off in the standard operating environment. The p-type drain region 11e of the p-channel enhancement type protective transistor 11a and the n-type substrate 13 form a parasitic diode, and the n-type drain region 11h and the p-type well 13a form a parasitic diode. The parasitic diodes do not allow current to pass therethrough in the standard operating environment, and the polysilicon gate electrode 10g is isolated from not only the first-level aluminum wirings 12e and 12g but also the n-type silicon substrate 13 and the p-type well 13a.

However, if electric charge are supplied to the polysilicon gate electrode 10g through the first-level aluminum wiring 12j due to a dry etching for forming the contact hole 14k, the electric charge is transferred through the first-level aluminum wirings 12k and 12m to both parasitic diodes, and is discharged to the n-type silicon substrate 13 or the p-type well 13a through either parasitic diode. For this reason, the polysilicon gate electrode 10g is restricted between the forward voltages of the parasitic diodes, and a strong electric field is not applied across the gate insulating layer. As a result, the gate insulating layers are not damaged in the fabrication process.

In this instance, the p-channel enhancement type protective transistor 11a and the associated parasitic diode serve as a first normally-off element, and the n-channel enhancement type protective transistor 11b and the associated parasitic diode as a whole serve as a second normally-off element. The silicon substrate 13 and the p-type well 13a serve as a constant voltage source.

The protective transistors 11a and 11b are not destroyed, and the parasitic diodes protects the gate insulating layers against excess electric charge during the fabrication process.

Second Embodiment

Figure 8:
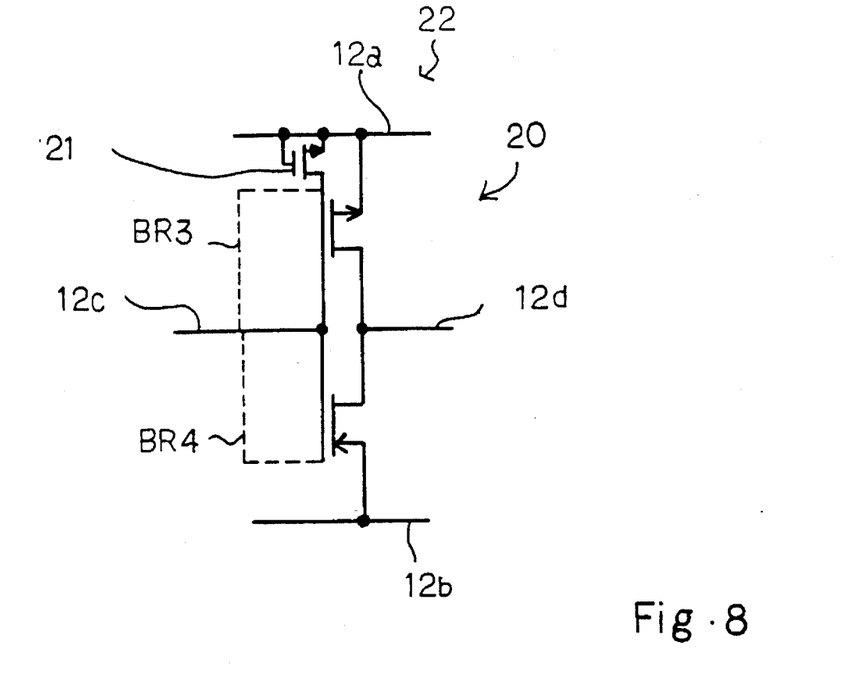
FIG. 8 is a circuit diagram showing the arrangement of an inverter and another protective transistor incorporated in a semiconductor integrated circuit device according to the present invention.

Turning to FIG. 8 of the drawings, an inverter 20, a p-channel enhancement type protective transistor 21 and a multi-level wiring structure 22 are incorporated in a semiconductor integrated circuit device embodying the present invention. The inverter 20 and the p-channel enhancement type protective transistor 21 are similar to the inverter 10 and the p-channel enhancement type protective transistor 11a, and are not detailed hereinbelow for avoiding repetition. In this instance, the p-channel enhancement type protective transistor 21 serves as a first normally-off element.

The inverter 20 is only accompanied with the p-channel enhancement type protective transistor 21, and an n-channel enhancement type protective transistor is deleted from the semiconductor integrated circuit device implementing the second embodiment. For this reason, the first-level aluminum wirings 12m and 12g are not incorporated in the multi-level wiring structure 22. The other aluminum wirings are labeled with the same references as those of the multi-level wiring structure 12.

A parasitic diode is implemented by the drain region of the p-channel enhancement type protective transistor 21 and a semiconductor substrate forming a p-n junction therewith, and the p-channel enhancement type protective transistor 21 and the parasitic diode are effective against electric charge due to, for example, a dry etching after formation of the polysilicon gate electrode of the inverter 20. Namely, if the polysilicon gate electrode of the inverter 20 is forwardly biased over the forward bias voltage VF or reversely biased under the breakdown voltage VBD of the parasitic diode, the parasitic diode allows current to flow therethrough. The forward bias voltage VF is about 1 volt with respect to the semiconductor substrate, and the breakdown voltage VBD ranges between −10 volts and −20 volts. Moreover, the protective transistors are a half of the protective transistors of the first embodiment.

Third Embodiment

Figure 9:
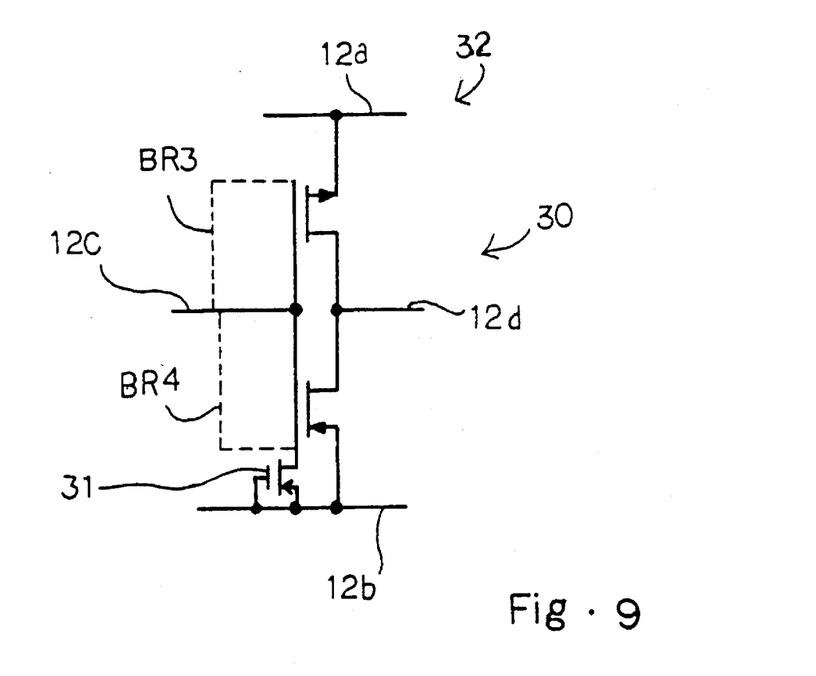
FIG. 9 is a circuit diagram showing the arrangement of an inverter and yet another protective transistor incorporated in a semiconductor integrated circuit device according to the present invention.

Turning to FIG. 9 of the drawings, an inverter 30, an n-channel enhancement type protective transistor 31 and a multi-level wiring structure 32 are incorporated in a semiconductor integrated circuit device embodying the present invention. The inverter 30 and the n-channel enhancement type protective transistor 31 are similar to the inverter 10 and the n-channel enhancement type protective transistor 11b, and are not detailed hereinbelow for avoiding repetition. In this instance, the n-channel enhancement type protective transistor 31 serves as a first normally-off element.

The inverter 30 is only accompanied with the n-channel enhancement type protective transistor 31, and a p-channel enhancement type protective transistor is deleted from the semiconductor integrated circuit device implementing the third embodiment. For this reason, the first-level aluminum wirings 12e and 12k are not incorporated in the multi-level wiring structure 32. The other aluminum wirings are labeled with the same references as those of the multi-level wiring structure 12.

The drain region of the n-channel enhancement type protective transistor 31 and a semiconductor substrate form a parasitic diode, and the parasitic diode is effective against excess electric charge after formation of the polysilicon gate electrode of the inverter 30. Namely, if the polysilicon gate electrode of the inverter 30 is forwardly biased over the forward bias voltage VF or reversely biased under the breakdown voltage VBD of a parasitic diode between the n-type drain region of the transistor 31 and the p-type well, the parasitic diode allows current to flow therethrough. The forward bias voltage is −1 volt, and the breakdown voltage VBD ranges from 10 volts to 20 volts in this instance.

Moreover, the protective transistors are a half of the protective transistors of the first embodiment.

Fourth Embodiment

Figure 10:
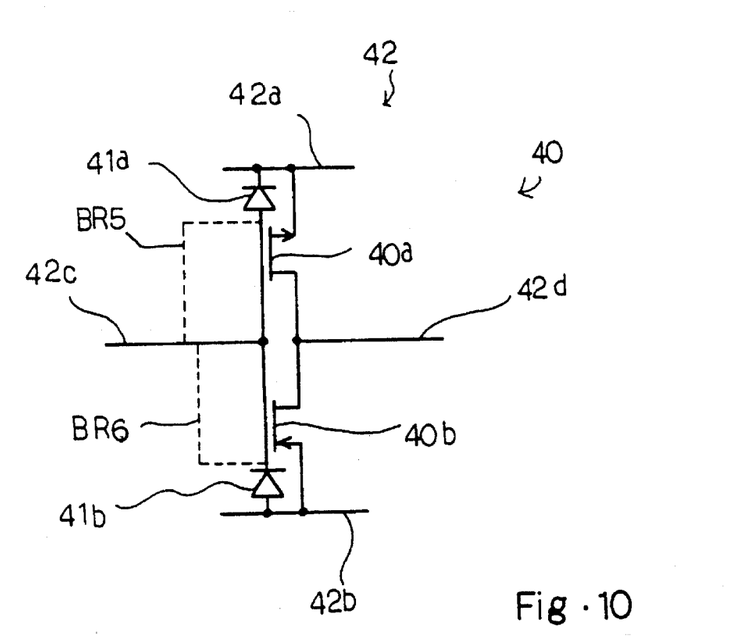
FIG. 10 is a circuit diagram showing the arrangement of an inverter and protective diodes incorporated in a semiconductor integrated circuit device according to the present invention.

Turning to FIG. 10 of the drawings, an inverter 40 is accompanied with protective diodes 41a and 41b, and a multi-level wiring structure 42 is provided for the inverter 40. The inverter 40, the protective diodes 41a and 41b and the multi-level wiring structure 42 form parts of a semiconductor integrated circuit device embodying the present invention. The protective diodes 11a and 11b serve as a first normally-off element and a second normally-off element, respectively.

The inverter 40 is implemented by a series combination of a p-channel enhancement type field effect transistor 40a and an n-channel enhancement type field effect transistor 40b coupled between a high power voltage line 42a and a low voltage line 42b. An input signal line 42c is connected to the gate electrode of the p-channel enhancement type field effect transistor 40a and the gate electrode of the n-channel enhancement type field effect transistor 40b, and an output signal line 42d is connected to the common drain node of the field effect transistors 40a and 40b. The high power voltage line 42a, the low voltage line 42b, the input signal line 42c and the output signal line 42d form parts of the multi-level wiring structure 42.

Although the input signal line 42c is branched at a mid point between the p-channel enhancement type field effect transistor 40a and the n-channel enhancement type field effect transistor 40b in FIG. 10, the input signal line 42c firstly passes through one of the p-channel enhancement type field effect transistor 40a and the n-channel enhancement type field effect transistor 40b as indicated by either broken line BR5 or BR6, and extends to the other field effect transistor 40b or 40a as similar to the first embodiment. Thus, the input signal line 42c partially serves as the gate electrode of the p-channel enhancement type field effect transistor 40a and the gate electrode of the n-channel enhancement type field effect transistor 40b.

The protective diode 41a has a cathode connected to the high power voltage line 42a and an anode connected to the input signal line 42c. On the other hand, the protective diode 41b has a cathode connected to the input signal line 42c and the anode connected to the low voltage line 42b. The protective diodes 41a and 41b are turned off in a standard operating emviroment. The term "standard operating environment" has the same meaning as that of the first embodiment. In the standard operating environment, the inverter 40 cooperates with other circuit components for achieving a task of the semiconductor integrated circuit device, and the input signal line 42c is changed in the voltage level between a normal voltage range.

Figure 11:
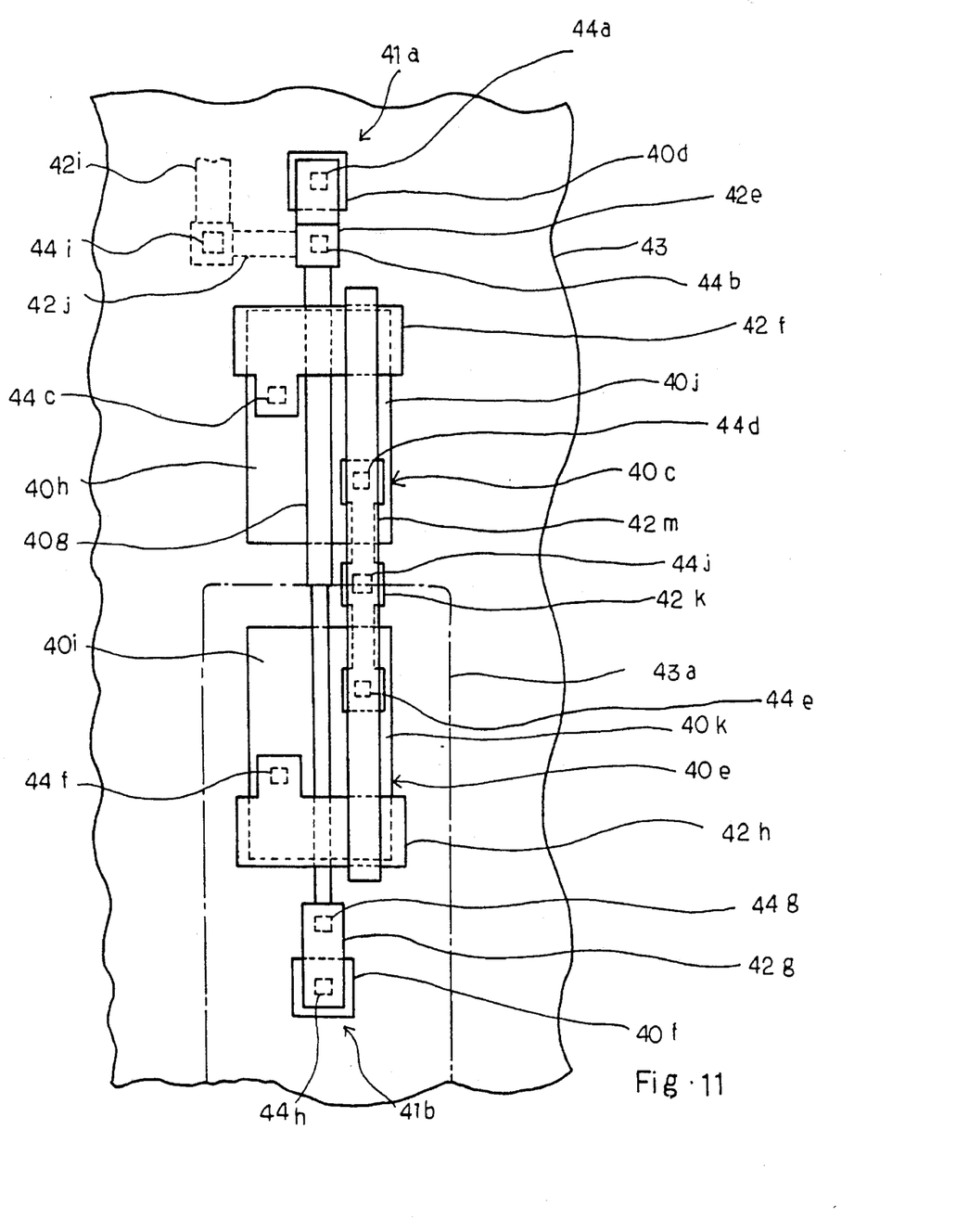
FIG. 11 is a plan view showing a layout of the inverter and the protective diodes.

Turning to FIG. 11 of the drawings, a layout of the inverter 40, the protective transistors 41a and 41b and the multi-level wiring structure 42 is illustrated, and is detailed hereinbelow. The semiconductor integrated circuit device embodying the present invention is fabricated on an n-type silicon substrate 43, and a p-type well 43a is formed in the n-type silicon substrate 43. A thick field oxide layer, a thin gate insulating layer and an inter-level insulating film structure are deleted from the illustration of FIG. 11 as similar to FIG. 7. In this instance, the n-type silicon substrate 43 and the p-type well 43a are biased with the high power voltage level Vdd and the low voltage level, respectively.

A wide p-type impurity region 40c and a narrow p-type impurity region 40d are formed in the n-type silicon substrate 43, and the wide p-type impurity region 40c is electrically isolated from the narrow p-type impurity region 40d. On the other hand, a wide n-type impurity region 40e and a narrow n-type impurity region 40f are formed in the p-type well 43a, and the wide n-type impurity region 40e is electrically isolated from the narrow n-type impurity region 40f. The gate insulating films (not shown) cover the wide p-type impurity region 40c and the wide n-type impurity region 40e, respectively, and a lower inter-level insulating layer (not shown) covers the narrow p-type impurity region 40d and the narrow n-type impurity region 40f.

A polysilicon gate electrode 40g extends on the gate insulating layers on the wide p-type impurity region 40c and the wide n-type impurity region 40e, and channel region under the polysilicon gate electrode 40g electrically separates a p-type source region 40h and an n-type source region 40i from a p-type drain region 40j and an n-type drain region 40k, respectively. The p-type source region 40h, the p-type drain region 40j, the gate insulating layer, the channel region and the polysilicon gate electrode 40g as a whole constitute the p-type enhancement type field effect transistor 40a, and the n-type source region 40i, the n-type drain region 40k, the gate insulating layer, the channel region and the polysilicon gate electrode 40g form the n-type enhancement type field effect transistor 40b.

The narrow p-type impurity region 40d forms the protective diode 41a together with the n-type silicon substrate 43, and serves as the anode of the protective diode 41a. Similarly, the narrow n-type impurity region 40f and the p-type well 43a form in combination the protective diode 41b, and serves as the cathode of the protective diode 41b.

The p-channel enhancement type field effect transistor 40a, the n-channel enhancement type field effect transistor 40b and the protective diodes 41a and 41b are covered with the lower inter-level insulating layer (not shown), and the lower inter-level insulating layer forms the inter-level insulating film structure together with an intermediate inter-level insulating layer (not shown) and an upper inter-level insulating layer (not shown).

The lower inter-level insulating layer has contact holes 44a, 44b, 44c, 44d, 44e, 44f, 44g and 44h, and contact holes 44$i$ and 44$j$ are formed in the intermediate inter-level insulating layer. The contact holes 44$a$ to 44$j$ allow the multi-level wiring structure 42 to provide interconnections.

In this instance, the multi-level wiring structure 42 has first-level aluminum wirings extending on the lower inter-level insulating layer and second-level aluminum wirings extending on the intermediate inter-level insulating layer, and the upper inter-level insulating layer covers the second-level aluminum wirings. Namely, a first-level aluminum wiring 42$e$ is held in contact through the contact hole 44$a$ with the narrow p-type impurity region 40$d$. Another first-level aluminum wiring 42$f$ passes through the contact hole 44$c$, and is held in contact with the p-type source region 40$h$. The first-level aluminum wiring 42$f$ serves as the high power voltage line 42$a$.

Similarly, a first-level aluminum wiring 42$g$ is held in contact through the contact hole 44$h$ with the narrow n-type impurity region 40$f$. Another first-level aluminum wiring 42$h$ passes through the contact hole 44$f$, and is in contact with the n-type source region 40$i$. The first-level aluminum wiring 42$h$ serves as the low voltage line 42$b$.

A second-level aluminum wiring 42$i$ is connected through the contact hole 44$i$ to a first-level aluminum wiring 42$j$, and the first-level aluminum wiring 42$j$ is merged with the first-level aluminum wiring 42$e$. The first-level aluminum wirings 42$j$ and 42$e$ are held in contact with the polysilicon gate electrode 40$g$. The polysilicon gate electrode 40$g$ is connected through the contact hole 44$g$ to the first-level aluminum wiring 42$g$. The second-level aluminum wiring 42$i$, the first-level aluminum wirings 42$j$, 42$e$ and 42$g$ and the polysilicon gate electrode 40$g$ form in combination the input signal line 42$c$.

A first-level aluminum wiring 42$k$ is connected at both end portions thereof through the contact holes 44$d$ and 44$e$ to the p-type drain region 40$j$ and the n-type drain region 40$k$, and in turn is connected at an intermediate portion through the contact hole 44$j$ to a second-level aluminum wiring 42$m$. The first-level aluminum wiring 42$k$ and the second-level aluminum wiring 42$m$ form in combination the output signal line 42$d$.

As described hereinbefore, the protective diodes 41$a$ and 41$b$ isolate the polysilicon gate electrode 40$g$ from the n-type silicon substrate 43 and the p-type well 43$a$ in the standard operating environment. However, if an excess voltage is applied to the polysilicon gate electrode 40$g$ due to, for example, a dry etching, the protective diode 41$a$ or 41$b$ discharges current. Thus, the protective diodes 41$a$ and 41$b$ prevent the thin gate insulating layers from destruction.

Fifth Embodiment

Figure 12:
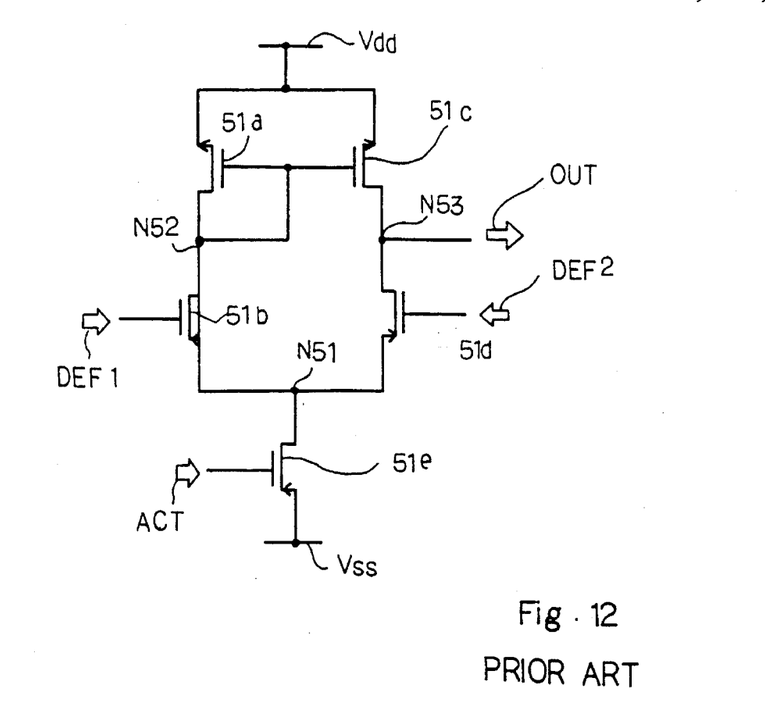
FIG. 12 is a circuit diagram showing a prior art sense amplifier circuit.

Field effect transistors accompanied with the normally turn-off elements are available for various electric circuits. FIG. 12 shows a prior art sense amplifier circuit coupled between two power voltage lines Vdd and Vss. The prior art sense amplifier circuit comprises a series combination of a p-channel enhancement type load transistor 51$a$ and an n-channel enhancement type amplifying transistor 51$b$ coupled between the power voltage line Vdd and a common node N51, a series combination of a p-channel enhancement type load transistor 51$c$ and an n-channel enhancement type amplifying transistor 51$d$ and an n-channel enhancement type activating transistor 51$e$ coupled between the common node N51 and the other power voltage line Vss. The gate electrodes of the p-channel enhancement type load transistors 51$a$ and 51$c$ are coupled to one of the common drain nodes N52, and a potential difference DEF1 and DEF2 is applied between the gate electrodes of the n-channel enhancement type amplifying transistors 51$b$ and 51$d$. An activation signal ACT is supplied to the gate electrode of the n-channel enhancement type amplifying transistor 51$e$.

When the activation signal ACT is changed to an active level, the n-channel enhancement type activating transistor 51$e$ turns on, and the two series combinations 51$a$/51$b$ and 51$c$/51$d$ increase the potential difference DEF1/DEF2, and produce an output signal OUT at the common drain node N53.

Figure 13:
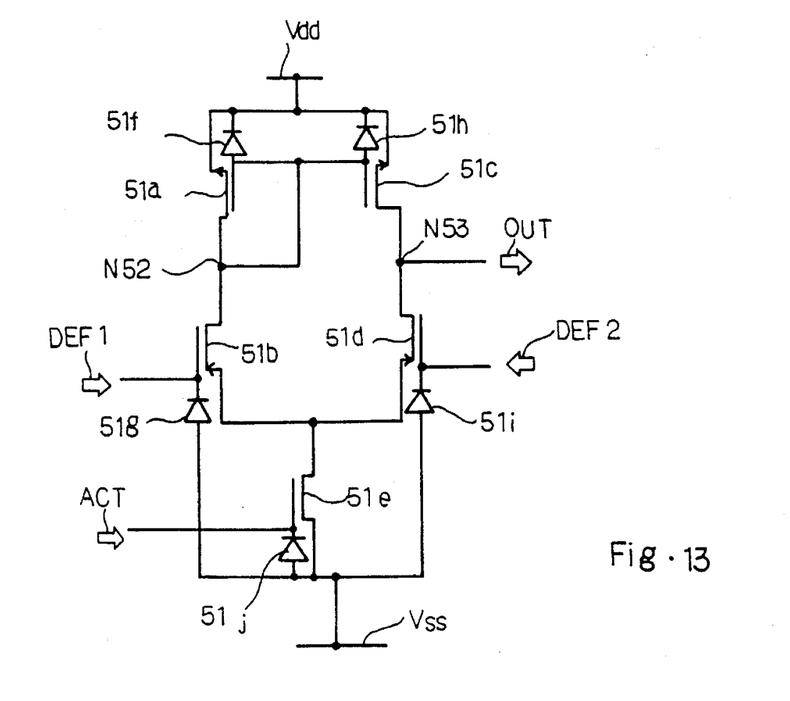
FIG. 13 is a circuit diagram showing a sense amplifier circuit and protective diodes incorporated in a semiconductor integrated circuit device according to the present invention.

In a semiconductor integrated circuit device embodying the present invention, protective diodes 51$f$, 51$g$, 51$h$, 51$i$ and 51$j$ are associated with the component field effect transistors 51$a$ to 51$e$ as shown in FIG. 13. Namely, the protective diodes 51$f$ and 51$h$ are coupled between the gate electrodes of the p-channel enhancement type load transistors 51$a$ and 51$c$ and the power voltage line Vdd, and the protective diodes 51$g$, 51$i$ and 51$j$ are coupled between the gate electrodes of the n-channel enhancement type transistors 51$b$, 51$d$ and 51$e$ and the other power voltage line Vss.

The protective diodes 51$f$ to 51$h$ do not turn on insofar as the common drain node N52 is lower than a critical level higher than the power voltage line Vdd by the forward bias voltage thereof. The other protective diodes 51$g$, 51$i$ and 51$j$ are also turned off as long as the gate electrodes is higher than another critical level lower than the low voltage line by the threshold thereof. The potential difference DEF1/DEF2 does not exceed both power voltage levels Vdd and Vss in a standard operating environment, and accordingly, the protective diodes 51$f$ to 51$j$ are turned off.

However, if an excess voltage is applied to the gate electrode of the component field effect transistor 51$a$/51$b$/51$c$/51$d$/51$e$ due to, for example, a dry etching, the associated protective diode discharges the excess voltage, and prevents the gate insulating layer of the field effect transistor from damage. An offset voltage between the p-channel enhancement type load transistors 51$a$/51$c$ or the n-channel enhancement type amplifying transistors 51$b$/51$d$ is decreased to several to tens millivolt, because the gate insulating layers are free from the damage due to the electric charges in the fabrication process, and, for this reason, the production yield is improved.

As will be appreciated from the foregoing description, the normally-off element or elements are effective against undesirable electric charge in the fabrication process of the semiconductor integrated circuit device, and do not disturb the operation of the semiconductor integrated circuit device in the standard operating emviroment. As a result, the gate insulating layers of the component field effect transistors are prevented from damages due to the electric charges.

Although particular embodiments of the present invention have been shown and described, it will be obvious to those skilled in the art that various changes and modifications may be made without departing from the spirit and scope of the present invention.

For example, the present invention is applicable to any digital/analog circuit insofar as a field effect transistor is incorporated in the digital/analog circuit. For example, another logic gate such as a NAND gate and an operational amplifier are the applicable circuits.

Moreover, the multi-level wiring structure is not limited to two levels, and the shared polysilicon gate electrode may be directly connected to the drain region/anode/cathode of the normally-off element.

What is claimed is:

1. A semiconductor integrated circuit device fabricated on a semiconductor substrate having a first field effect transistor, said semiconductor integrated circuit device comprising:

source and drain regions formed in a surface portion of said semiconductor substrate, a gate electrode layer covering said surface portion, said gate electrode extending on a gate insulating layer of said field effect transistor, a voltage level of said gate electrode being controlled such that said voltage is not permitted to change outside of a predetermined range in a standard operation of said semiconductor integrated circuit device;

an inter-level insulating film structure having a first inter-level insulating layer covering said semiconductor substrate and a second inter-level insulating layer covering said first inter-level insulating layer;

a multi-level wiring structure having a plurality of power supply lines and signal lines, said multi-level wiring structure comprising:

a plurality of first-level wirings extending on said first inter-level insulating layer, with a first contact hole being formed in said first inter-level insulating layer, such that said first level wirings connect said first inter-level insulating layer to said gate electrode through said first contact hole, and a plurality of second-level wirings extending on said second inter-level insulating layer, with a second contact hole being formed in said second inter-level insulating layer, such that said second level wirings selectively connect said second inter-level insulating layer to said first-level wirings and to said field effect transistor through said first contact hole;

a first parasitic diode coupled between said gate electrode and one of said power supply lines, said parasitic diode having a threshold, said threshold determining said predetermined range such that electric charges are allowed to flow through said diode to a constant voltage source when said gate electrode exceeds said threshold, said exceeding of said threshold typically occurring in a manufacturing process of said semiconductor integrated circuit device.

2. The semiconductor integrated circuit device as set forth in claim 1, wherein:

said first parasitic diode is implemented by a combination of an enhancement type field effect transistor of a first channel conductivity type, said enhancement type transistor having source and drain regions coupled between said gate electrode and said one of said power supply lines, said gate electrode being coupled to said one of said power supply lines, said parasitic diode being formed between said drain region and said surface portion of said semiconductor substrate.

3. The semiconductor integrated circuit device as set forth in claim 1, further comprising:

a second parasitic diode coupled between said gate electrode and one of said power supply lines, said second parasitic diode having a second threshold, said second threshold determining another predetermined range such that electric charges are allowed to flow through said second diode to a constant voltage source when said gate electrode goes below said second threshold in voltage.

4. The semiconductor integrated circuit device as set forth in claim 3, in which said first parasitic diode is implemented by a combination of:

an enhancement type field effect transistor of one channel conductivity type having a first source region coupled to one of said power supply lines, and a first drain region coupled to said gate electrode of said first field effect transistor;

said first gate electrode being coupled to said one of said power supply lines and said first parasitic diode being formed between said first drain region and a first area of said surface portion of said semiconductor substrate;

said second parasitic diode being implemented by a combination of:

another enhancement type field effect transistor of an opposite channel conductivity type to said first enhancement type field effect transistor, having a second source region coupled to another of said power supply lines, and a second drain region coupled to said gate electrode of said first field effect transistor;

said second gate electrode being coupled to said another of said power supply lines, said second parasitic diode being formed between said second drain region and a second surface portion of said semiconductor substrate.

5. The semiconductor integrated circuit device as set forth in claim 1, further comprising:

a second field effect transistor coupled in series to said first field effect transistor for forming an inverter.

6. The semiconductor integrated circuit device as set forth in claim 1, further comprising:

a plurality of second field effect transistors forming an electric circuit together with said first field effect transistor.

7. The semiconductor integrated circuit device as set forth in claim 4, further comprising:

a second field effect transistor coupled in series to said first field effect transistor for forming an inverter.

8. The semiconductor integrated circuit device as set forth in claim 1, wherein:

said first parasitic diode is implemented by a diode coupled between said gate electrode of said first field effect transistor and said constant voltage source.

9. The semiconductor integrated circuit device as set forth in claim 8, wherein:

said diode comprises impurity region and a second surface portion of said semiconductor substrate, said second surface portion being of an opposite conductivity type to said first surface portion.

10. The semiconductor integrated circuit device as set forth in claim 1, further comprising:

a second parasitic diode coupled to said gate electrode of said first field effect transistor and said constant voltage source, such that:

said first parasitic diode is implemented by a first diode having an anode coupled to said gate electrode of said first field effect transistor and a cathode coupled to said constant voltage source, and said second parasitic diode is implemented by a second diode having an anode coupled to said constant voltage source and a cathode coupled to said gate electrode of said first field effect transistor.

11. The semiconductor integrated circuit device as set forth in claim 10, wherein:

said first diode is implemented by the use of a first impurity region of a first conductivity type and said surface portion of said semiconductor substrate having an opposite conductivity type to said first conductivity type, said second diode is implemented by the use of a second impurity region of said opposite conductivity type and another surface portion of said semiconductor substrate of said first conductivity type.

* * * * *